United States Patent
Kudo et al.

(10) Patent No.: US 8,673,435 B2
(45) Date of Patent: Mar. 18, 2014

(54) COATED CBN SINTERED BODY TOOL

(75) Inventors: Takahide Kudo, Iwaki (JP); Hiroyuki Miura, Iwaki (JP); Takashi Umemura, Iwaki (JP)

(73) Assignee: Tungaloy Corporation, Iwaki-shi, Fukushima (JP)

(*) Notice: Subject to any disclaimer, the term of this patent is extended or adjusted under 35 U.S.C. 154(b) by 0 days.

(21) Appl. No.: 13/808,575

(22) PCT Filed: Jul. 6, 2011

(86) PCT No.: PCT/JP2011/065424
§ 371 (c)(1),
(2), (4) Date: Jan. 4, 2013

(87) PCT Pub. No.: WO2012/005275
PCT Pub. Date: Jan. 12, 2012

(65) Prior Publication Data
US 2013/0108850 A1    May 2, 2013

(30) Foreign Application Priority Data
Jul. 6, 2010   (JP) ................................. 2010-153696

(51) Int. Cl.
*B23B 27/14*    (2006.01)
(52) U.S. Cl.
USPC .......................................... 428/216; 428/220
(58) Field of Classification Search
USPC ......................................................... 428/216
See application file for complete search history.

(56) References Cited

U.S. PATENT DOCUMENTS

| | | | |
|---|---|---|---|
| 3,971,656 A | 7/1976 | Rudy | |
| 4,778,521 A | 10/1988 | Iyori et al. | |
| 5,308,376 A | 5/1994 | Oskarsson | |
| 5,853,873 A | 12/1998 | Kukino et al. | |
| 5,882,777 A | 3/1999 | Kukino et al. | |
| 5,939,651 A | 8/1999 | Isobe et al. | |
| 6,057,046 A | 5/2000 | Tsuda et al. | |
| 6,299,992 B1 | 10/2001 | Lindskog et al. | |
| 6,316,094 B1* | 11/2001 | Fukaya et al. | 428/323 |
| 6,814,775 B2* | 11/2004 | Scurlock et al. | 75/244 |
| 7,867,438 B2* | 1/2011 | Can et al. | 419/10 |
| 2004/0002418 A1* | 1/2004 | Scurlock et al. | 501/96.4 |
| 2004/0237840 A1 | 12/2004 | Yamamoto et al. | |
| 2006/0222893 A1 | 10/2006 | Derflinger | |
| 2006/0269788 A1 | 11/2006 | Ishikawa | |
| 2007/0234646 A1 | 10/2007 | Can et al. | |
| 2007/0269610 A1 | 11/2007 | Fukui et al. | |
| 2008/0254282 A1 | 10/2008 | Kukino et al. | |
| 2009/0049953 A1 | 2/2009 | Shindo et al. | |
| 2009/0080986 A1* | 3/2009 | Can et al. | 407/119 |
| 2011/0114393 A1* | 5/2011 | Dolan et al. | 175/428 |
| 2011/0117368 A1 | 5/2011 | Matsubara et al. | |
| 2011/0174549 A1* | 7/2011 | Dolan et al. | 175/428 |
| 2011/0176879 A1* | 7/2011 | Jonker et al. | 408/144 |
| 2012/0003466 A1 | 1/2012 | Tamura et al. | |
| 2012/0114960 A1 | 5/2012 | Takesawa et al. | |
| 2012/0208006 A1* | 8/2012 | Okamura et al. | 428/328 |
| 2013/0034712 A1* | 2/2013 | Kudoh et al. | 428/216 |

FOREIGN PATENT DOCUMENTS

| | | |
|---|---|---|
| DE | 19704242 C1 | 8/1998 |
| EP | 1714942 | 10/2006 |
| JP | 61-195950 | 8/1986 |
| JP | 61-227910 | 10/1986 |
| JP | 62-193731 | 8/1987 |
| JP | 62-265107 | 11/1987 |
| JP | 64-068443 | 3/1989 |
| JP | 02-015139 | 1/1990 |
| JP | 02-093036 | 4/1990 |
| JP | 04-231467 | 8/1992 |
| JP | 08-309605 | 11/1996 |
| JP | 09-078174 | 3/1997 |
| JP | 02-628200 | 7/1997 |
| JP | 10-110234 | 4/1998 |
| JP | 2000-44348 | 2/2000 |
| JP | 03-152105 | 4/2001 |
| JP | 2001-181825 | 7/2001 |
| JP | 2002-302732 | 10/2002 |
| JP | 2003-136305 | 5/2003 |

(Continued)

OTHER PUBLICATIONS

Zhang S, et al "Solid Solution Extent of WC and TaC in Ti(C,N) as Revealed by Lattice Parameter Increase", Int. J. of Refractory Metals & Hard Materials, vol. 12, No. 6 (Jan. 1, 1993) pp. 329-333.
Suzuki, Hard Alloy and Sintered Hart Material (1986) p. 329, fig. 2.34.
Extended European search report dated Jul. 20, 2012 issued in European counterpart application (No. 09797929.8).
Kikai Gijutu (2009) vol. 57, No. 4, pp. 32-37 with English translation (extract).
International Search Report dated Sep. 13, 2011 issued in PCT counterpart application (No. PCT/JP2011/065424).

(Continued)

*Primary Examiner* — David Sample
*Assistant Examiner* — Tahseen N Khan
(74) *Attorney, Agent, or Firm* — Womble Carlyle

(57) ABSTRACT

A coated cBN sintered body tool has improved wear resistance and fracture resistance. The coated cBN sintered body tool has a substrate of a cBN sintered body and a coating layer coated on the surface thereof. The cBN sintered body includes 73 to 84% by volume of cBN and 16 to 27% by volume of a binder phase and inevitable impurities. An average grain size of the cBN is 1.5 to 4.0 μm; an average value of the thickness of the binder phase is 0.05 to 0.5 μm; and a standard deviation of the thickness of the binder phase is 0.5 μm or less. The coating layer includes an upper layer of $Ti(C_xN_{(1-x)})$, an intermediate layer including a metal, a lower layer including an alternately laminated layer of $(Ti_{(1-y)}Si_y)N$ thin layers and $(Al_{(1-z)}Cr_z)N$ thin layers, and an undermost layer of $(Al_{(1-a)}Cr_a)N$.

23 Claims, No Drawings

(56) References Cited

FOREIGN PATENT DOCUMENTS

| | | |
|---|---|---|
| JP | 2004-292842 | 10/2004 |
| JP | 2005-194573 | 7/2005 |
| JP | 2005-200668 | 7/2005 |
| JP | 2006-111947 | 4/2006 |
| JP | 2006-315898 | 11/2006 |
| JP | 2007-084382 | 4/2007 |
| JP | 2008-188689 | 8/2008 |
| JP | 2008-208027 | 9/2008 |
| JP | 2009-034781 | 2/2009 |
| JP | 2009-067637 | 4/2009 |
| JP | 2010-031308 | 2/2010 |
| WO | WO 98/34874 | 8/1998 |

OTHER PUBLICATIONS

Written Opinion dated Sep. 13, 2011 issued in PCT counterpart application (No. PCT/JP2011/065424).

Official action dated Aug. 13, 2013 issued in Japanese counterpart application (No. 2011-519398) with English translation.

M. Pancielejko et al "Structure, chemical and phase composition of hard titanium carbon nitride coatings deposited on HS 6-5-2 steel" *Journal of Materials Processing Technology*, 2004, vol. 157-158, pp. 394-398.

Takayuki Murotani et al "Study on stress measurement of PVD-coating layer" *Thin Solid Films*, 2000, vol. 377-378, pp. 617-620.

* cited by examiner

COATED CBN SINTERED BODY TOOL

RELATED APPLICATIONS

This is a 371 U.S. National Phase of International Patent Application No. PCT/JP2011/065424, filed Jul. 6, 2011, and published as WO 2012/005275A1 on Jan. 12, 2012, which claims priority to JP 2010-153696, filed Jul. 6, 2010. The contents of the aforementioned applications are incorporated by reference in their entirety.

TECHNICAL FIELD

The present invention relates to a coated cBN sintered body tool at least a cutting edge of which comprises a coated cBN sintered body.

BACKGROUND ART

The cBN sintered body has high hardness and excellent in thermal conductivity, so that it has been used as a cutting tool for machining a hardened steel or heat-resistant alloy. As a prior art of the cBN sintered body tool, there is a cBN sintered body tool having a cBN content of 40 to 80 vol % in which the cBN is bonded through a ceramics binder comprising a Ti compound which has a low affinity to an iron-group metal (excellent in thermal and chemical stability) (for example, see Non-Patent Literature 1.). In FIG. 1 of Non-Patent Literature 1, there are disclosed that in a hardened steel machining using a cBN sintered body tool, if a content of cBN is low, a wear amount is small (wear resistance becomes high) but fracture resistance is poor, to the contrary, if the content of cBN is high, fracture resistance is high but the wear amount is large (wear resistance is lowered). That is, it was difficult in the cBN sintered body tool to improve wear resistance and fracture resistance simultaneously.

As a method for improving wear resistance of the cBN sintered body tool, there is a method of covering a coating excellent in wear resistance on the surface of the tool. As the prior art of the coated cBN sintered body tool in which the coating layer is coated on the cBN sintered body, there is a composite high-hardness material for a hardened steel cutting tool in which a TiAlN film having an atomic ratio X of Ti/(Ti+Al) being 0.3≤X≤0.5 is coated on the surface of a substrate which comprises a CBN sintered body containing 20% by volume or more of cubic boron nitride (for example, see Patent Literature 1.). However, regarding the composite high-hardness material for a hardened steel cutting tool coated by the TiAlN film, there are problems that if the content of the cBN contained in the substrate is low, fracture resistance is lowered, to the contrary, if the content of the cBN contained in the substrate becomes high, adhesiveness between the TiAlN film and the substrate is lowered whereby the TiAlN film is peeled off, which causes lowering in wear resistance. That is, in the coated cBN sintered body tool, it was difficult to improve wear resistance and fracture resistance simultaneously.

PRIOR ART LITERATURE

Non-Patent Literature

[Non-Patent Literature 1] Satoru Kukino, "Coated cBN tool for machining hardened steel "Sumiboron BNC Series"", Mechanical Engineering, THE NIKKAN KOGYO SHINBUN LTD., Apr. 1, 2009, Vol. 57, No. 4, p. 32-37

Patent Literature

[Patent Literature 1] JP 3866305B

SUMMARY OF THE INVENTION

Problems to be Solved by the Invention

In recent years, work piece materials are becoming more difficult to be cut so that a tool life tends to be lowered, and on the other hand, cutting of complicated shapes has been increasing in number and various kinds of small quantity production has been increasing in number. Therefore, cutting tools have now been required to have both of excellent wear resistance and excellent fracture resistance for elongating tool life. Thus, an object of the present invention is to provide a coated cBN sintered body tool in which wear resistance and fracture resistance are improved simultaneously and which can elongate the tool life than that of the conventional ones.

Means to Solve the Problems

The present inventors have researched on improvement of life of a coated cBN sintered body to be used for cutting, and as a result, they have found that a coated cBN sintered body tool in which on the surface of a substrate of a cBN sintered body wherein a content of cBN (cubic boron nitride) is made high and dispersion of the thickness of a binder phase is made small, is coated a coating layer comprising an upper layer of TiCN excellent in wear resistance, an intermediate layer of Ti which relaxes adhesiveness between each layer of the coating layer and compressive stress of the coating layer, a lower layer in which a first thin layer of TiSiN having an average layer thickness of 30 to 200 nm which has high hardness and low Young's modulus and a second thin layer of AlCrN having an average layer thickness of 30 to 200 nm which has low hardness and high Young's modulus are alternately laminated, and an undermost layer of AlCrN excellent in adhesiveness with the cBN sintered body, is excellent in wear resistance and fracture resistance, and can elongate tool life.

The present invention is directed to a coated cBN sintered body tool which comprises a substrate of a cBN sintered body and a coating layer coated on the surface thereof, the cBN sintered body comprises 73 to 84% by volume of cBN; and 16 to 27% by volume of a binder phase which comprises at least one selected from a group consisting of a metal of Ti, W, Co and Al, a carbide, a nitride, a boride and an oxide of these metals and a mutual solid solution thereof, and inevitable impurities; an average grain size of cBN is 1.5 to 4.0 μm, a binder phase has an average value of the thickness of the binder phase of 0.05 to 0.5 μm, and a standard deviation of the thickness of the binder phase is 0.5 μm or less, the coating layer comprises an upper layer, an intermediate layer, a lower layer and an undermost layer, (1) the upper layer comprises a compound represented by the compositional formula of $Ti(C_xN_{1-x})$ (wherein x represents an atomic ratio of C based on the total amount of C and N, and satisfies 0≤x≤0.7.) having an average layer thickness of 0.3 to 2.0 μm, (2) the intermediate layer comprises one or more metals selected from the components of Ti, Al, Cr and Si, and has an average layer thickness of 10 to 100 nm, (3) the lower layer comprises an alternately laminated layer comprising a first thin layer which comprises a compound represented by a compositional formula of $(Ti_{1-y}Si_y)N$ (wherein y represents an atomic ratio of Si based on the total amount of Ti and Si, and satisfies 0.01≤y≤0.3.), and has an average layer thickness of 30 to 200 nm, and a second thin layer which comprises a compound represented by a compositional formula of $(Al_{(1-z)}Cr_z)N$ (wherein z represents an atomic ratio of Cr based on the total amount of Al and Cr, and satisfies 0.2≤z≤0.5.), and has an average layer thickness of 30 to 200 nm the first and second thin layers being alternately laminated with an average layer thickness of 0.12 to 1.6 μm with respect to the whole alternately laminated layer, and (4) the undermost layer comprises a compound represented by a compositional formula of $(Al_{(1-a)}Cr_a)N$ (wherein a represents an atomic ratio of Cr based on the total amount of Al and Cr, and satisfies 0.2≤a≤0.5.), and has an average layer thickness of 20 to 200 nm.

Effects of the Invention

The coated cBN sintered body tool of the present invention is excellent in wear resistance and fracture resistance. Thus, the coated cBN sintered body tool of the present invention can provide an effect of having longer tool life. Its effects are particularly high in the machining of a high hardness material.

BEST MODE TO CARRY OUT THE INVENTION

In the cBN sintered body of the present invention, if an amount of the cBN becomes large exceeding 84% by volume, and an amount of the binder phase and inevitable impurities becomes less than 16% by volume, adhesiveness between the substrate and the coating layer becomes worse and abnormal wear accompanied by peeling of the coating layer occurs to lower wear resistance. To the contrary, if an amount of the cBN becomes less than 73% by volume, and an amount of the binder phase and inevitable impurities becomes large exceeding 27% by volume, a ratio of the binder phase having relatively lower strength increases so that fracture resistance is lowered. Therefore, cBN is set at 73 to 84% by volume, and the binder phase and inevitable impurities at 16 to 27% by volume. Among these, it is further preferred that cBN is 75 to 80% by volume and the binder phase and inevitable impurities are 20 to 25% by volume. The content of the cBN, and the contents of the binder phase and inevitable impurities can be obtained by observing the cross-sectional structure of the cBN sintered body by SEM (Scanning Electron Microscope), and analyzing the image of the photograph of the cross-sectional structure taken at 1000 to 5000-fold magnification.

If an average grain size of the cBN contained in the cBN sintered body of the present invention is less than 1.5 μm, thermal conductivity of the cBN sintered body is lowered. When thermal conductivity of the cBN sintered body is lowered, the cutting edge holds high temperature at the time of cutting, so that strength of the coating layer is lowered, and abnormal wear occurs due to thermal decomposition of the coating layer, whereby wear resistance of the coated cBN sintered body tool tends to be lowered. If an average grain size of the cBN becomes large exceeding 4.0 μm, a contacting area of the coating layer and the cBN having low chemical affinity becomes broad so that adhesiveness between the coating layer and the cBN sintered body becomes worse, and abnormal wear occurs accompanied by peeling of the coating layer, whereby wear resistance tends to be lowered. Therefore, the average grain size of the cBN is set at 1.5 to 4.0 μm. Among these, the average grain size of the cBN is further preferably 2.0 to 3.0 μm. The average grain size of the cBN according to the present invention can be obtained from the photograph of the cross-sectional structure of the cBN sintered body by SEM with 1000 to 5000-fold magnification, by using the Fullman's equation (Formula 1).

$$dm=(4/\pi)\times(NL/NS) \qquad \text{(Formula 1)}$$

(in Formula 1, dm represents an average grain size, π represents a circular constant, NL represents a number of the cBN per a unit length hit by an arbitrary line on the cross-sectional structure, and NS represents a number of the cBN contained in an arbitrary unit area.).

The binder phase of the cBN sintered body according to the present invention comprises at least one selected from a group consisting of a metal of Ti, W, Co and Al, a carbide, a carbonitride, a nitride, a boronitride, a boride and an oxide of these metals and a mutual solid solution thereof. More specifically, there may be mentioned TiN, TiCN, TiC, $TiB_2$, TiBN, TiAlN, $Ti_2AlN$, AlN, $AlB_2$, $Al_2O_3$, WC, WB, $W_2B$, CoWB, $W_2Co_{21}B_6$, $Co_3W_3C$, W, Co, Ti, etc. Among these, for cutting a hardened steel, at least one of TiN, TiCN, TiC, AlN, $AlB_2$, $Al_2O_3$, $TiB_2$, CoWB, $W_2Co_{21}B_6$ and WC is more preferred since tool life is improved, and above all, at least one of TiN, TiCN, TiC, AlN, $AlB_2$, $Al_2O_3$ and $TiB_2$ is further preferred since tool life in cutting of a high hardness material is improved.

If an average value of the thickness of the binder phase of the cBN sintered body according to the present invention becomes less than 0.05 μm, adhesiveness between the substrate and the coating layer becomes worse, abnormal wear occurs accompanied by peeling of the coating layer and wear resistance is lowered, while if an average value of the thickness of the binder phase becomes large exceeding 0.5 μm, the stress at the time of machining is concentrated to the binder phase and fracture resistance is lowered. Therefore, the average value of the thickness of the binder phase is set at 0.05 to 0.5 μm. Among these, an average value of the thickness of the binder phase is further preferably 0.1 to 0.4 μm.

The standard deviation of the thickness of the binder phase in the cBN sintered body according to the present invention can be obtained by using the following (Formula 2).

$$\sigma = \left( \frac{\sum_{i=1}^{n}(D_i - D)^2}{n} \right)^{1/2} \qquad \text{(Formula 2)}$$

(In Formula 2, σ represents a standard deviation of the thickness of the binder phase, $D_i$ represents a measured value of the thickness of the binder phase, D represents an average value of the thickness of the binder phase, and n is a number of measured points.). If the standard deviation of the thickness of the binder phase becomes large exceeding 0.5 μm, the stress at the time of the machining is concentrated to the portion at which an amount of the binder phase is relatively high, which becomes an origin of the fracture whereby fracture resistance is lowered. Also, at the portion at which an amount of the binder phase is relatively low, adhesiveness between the cBN sintered body and the coating layer becomes worse, and abnormal wear accompanied by peeling of the coating layer occurs whereby wear resistance is lowered. Therefore, it is set at 0.5 μm or less. Further preferred standard deviation of the thickness of the binder phase is 0.4 μm or less. It is practically difficult to make the standard deviation of the thickness of the binder phase less than 0.05 μm, so that the standard deviation of the thickness of the binder phase is practically preferably in the range of 0.05 to 0.5 μm, more preferably in the range of 0.05 to 0.4 μm. The average value and the standard deviation of the thickness of the binder phase can be obtained by taking a picture of the cross-sectional structure of the cBN sintered body by SEM with 1000 to 5000-fold magnification, drawing straight lines arbitrarily on the obtained 1000 to 5000-fold cross-sectional structure photograph, measuring the length of the straight lines crossing with the binder phases which are on the straight lines as a thickness of the binder phase, and calculating the average value and the standard deviation thereof. At this time, according to image analysis, it is preferred to measure the thickness of the binder phase according to the method as well. Also, it is preferred that the number of the measured points of the thickness of the binder phase is as many as possible since reliability of the average value and the standard deviation increases. More specifically, it is preferred that the number of the measured points is, for example, 200 or more per one cross-section and the number of the measured points is 600 or more which are measured on at least three cross-sections.

In the preparation method of the cBN sintered body of the present invention, to realize the average value and the standard deviation of the thickness of the binder phase stipulated in the present invention, it is preferably carried out a wet ball-mill mixing using WC-based cemented carbide balls in the step of mixing the starting powders. However, when the WC-based cemented carbide balls are used, a tungsten element is contaminated into the cBN sintered body. The tungsten element contaminated into the cBN sintered body exists in a form of WC, WB, $W_2B$, CoWB, $W_2Co_{21}B_6$, $Co_3W_3C$, W, etc. The metal of W and the tungsten compounds likely become an origin of fracture or crack at the time of cutting, so that the amount of the tungsten element contained in the whole cBN sintered body of the present invention is preferably 3% by mass or less, and among these, further preferably 2% by mass or less. However, in the preparation step of the cBN sintered body of the present invention, when the phase having brittleness obtained by subjecting the binder phase-forming powders to heat treatment is to be pulverized, high pulverization efficiency can be obtained when wet ball milling using WC-based cemented carbide balls is employed. During the step, the tungsten element is contaminated into the cBN sintered body in an amount of 0.2% by mass or more. Thus, the amount of the tungsten element contained in the whole cBN sintered body is actually preferably 0.2 to 3% by mass, and among these, further preferably 0.2 to 2% by mass. The amount of the tungsten element contained in the whole cBN sintered body of the present invention can be measured by using EDS (Energy Dispersive X-ray Spectrometry) or ICP-AES (Inductively Coupled Plasma Atomic Emission Spectrometer), etc.

Inevitable impurities of the cBN sintered body of the present invention may be mentioned Fe which is contaminated during the preparation process of the cBN sintered body. Total amount of the inevitable impurities is 1.0% by mass or less based on the whole cBN sintered body, and it can be usually controlled to 0.5% by mass or less based on the whole cBN sintered body, so that it does not exert any effect on the characteristic values of the present invention. In the present invention, in addition to the cBN, the binder phase and inevitable impurities, a small amount of the other component which cannot be said to be inevitable impurities may be contained within the range which does not impair the characteristics of the cBN sintered body of the present invention.

If the thermal conductivity of the cBN sintered body of the present invention becomes less than 70 W/(m·K), chemical reaction wear is promoted to lower wear resistance. Also, high temperature strength of the coating layer is lowered, abnormal wear occurs due to thermal decomposition of the coating layer and wear resistance tends to be lowered, so that the thermal conductivity of the cBN sintered body is preferably 70 W/(m·K) or more, more preferably 80 W/(m·K) or more. The thermal conductivity of the cBN sintered body is preferably as high as possible, but the thermal conductivity of the cBN sintered body of the present invention cannot be high exceeding 160 W/(m·K), so that the thermal conductivity is preferably within the range of 70 to 160 W/(m·K), and among these, more preferably within the range of 80 to 160 W/(m·K). Thermal conductivity of the cBN sintered body of the present invention can be measured by the laser flash method, etc.

The coating layer of the present invention comprises the undermost layer at the side of the substrate, the lower layer, the intermediate layer, and the upper layer at the side of the surface. The coating layer of the present invention may contain an outermost layer coated on the surface of the upper layer, other than the undermost layer, the lower layer, the intermediate layer and the upper layer.

When the upper layer of the present invention is constituted by the compound represented by the compositional formula of $Ti(C_xN_{(1-x)})$ (wherein x represents an atomic ratio of C based on the total amount of C and N, and satisfies $0 \leq x \leq 0.7$.) and has an average layer thickness of 0.3 to 2.0 µm, strength at high temperatures becomes high so that wear resistance and thermal resistance can be improved. Also, if the layer thickness of the upper layer is less than 0.5 µm, the upper layer is too thin and effects of improving wear resistance and thermal resistance cannot be obtained. To the contrary, if the layer thickness of the upper layer becomes thick exceeding 2.0 µm, chipping is likely caused at the initial stage of the processing. Therefore, the average layer thickness of the upper layer is set at 0.5 to 2.0 µm. Among these, the average layer thickness of the upper layer is further preferably 0.5 to 1.5 µm. Here, the average layer thickness of the upper layer was measured by SEM observation of the cross-section of the upper layer with 5000 to 30000-fold magnification. In the present invention, otherwise specifically mentioned, the average layer thickness of the respective layers means an average value of the layer thickness obtained by observing cross-sections of the respective layers by SEM or TEM (Transmission Electron Microscope) and measuring layer thicknesses of 5 portions or more. If an atomic ratio of C based on the total amount of C and N of the upper layer exceeds 0.7, a grain size of the upper layer becomes fine, and wear proceeds due to dropping of the grains so that wear resistance is lowered. Thus, the atomic ratio of C based on the total amount of C and N of the upper layer is set at $0 \leq x \leq 0.7$. Among these, the atomic ratio of C based on the total amount of C and N of the upper layer is further preferably $0.4 \leq x \leq 0.6$. Also, when the atomic ratio of C based on the total amount of C and N of the upper layer is so constituted that it increases from the substrate side toward the outermost surface side, it is preferred since no stress concentration in the upper layer occurs whereby breakage of the coating layer is hard to be caused.

The intermediate layer of the present invention is a metal layer comprising at least one component selected from the group consisting of Ti, Al, Cr and Si and has an average layer thickness of 10 to 100 nm, which improves adhesiveness between the lower layer and the upper layer, and prevents peeling of the lower layer and the upper layer. If the average layer thickness of the intermediate layer is less than 10 nm, an effect of improving adhesiveness of the lower layer and the upper layer cannot be obtained, and an effect of relaxing compressive stress of the coating layer cannot be obtained. If it becomes thick exceeding 100 nm, sliding occurs in the intermediate layer at the time of machining and the upper layer is peeled off whereby wear resistance is lowered. Thus, the average layer thickness of the intermediate layer is set at 10 to 100 nm. Among these, the average layer thickness of the intermediate layer is preferably 20 to 70 nm. Here, the average layer thickness of the intermediate layer was measured by SEM observation of the cross-section of the lower layer with 30000 to 100000-fold magnification. In addition to the SEM observation, the average layer thickness may be measured by carrying out a TEM observation. When the component of the intermediate layer is at least one of Ti, AlCr and TiSi, then it is preferred since chemical affinity with the upper layer and the lower layer is high, and an effect of improving adhesiveness between the upper layer and the lower layer is high. Among these, at least one of Ti and AlCr is further preferred. It is more preferably Ti.

The lower layer of the present invention comprises alternately laminated layers comprising the first thin layer of TiSiN which has high hardness and low Young's modulus, and the second thin layer of AlCrN which has low hardness and high Young's modulus, and shows excellent cutting properties. The first thin layer comprises a compound represented by the compositional formula of $(Ti_{(1-y)}Si_y)N$ (wherein y represents an atomic ratio of Si based on the total amount of Ti and Si, and satisfies $0.01 \leq y \leq 0.3$.) and has an average layer thickness of 30 to 200 nm. The first thin layer has high hardness and low Young's modulus. If y is less than 0.01, sufficient hardness cannot be obtained, while if y exceeds 0.3, an amount of amorphous $Si_3N_4$ segregated in the first thin layer increases and the hardness is lowered, so that it is set at $0.01 \leq y \leq 0.3$. Among these, it is more preferably $0.05 \leq y \leq 0.2$ since the hardness of the first thin layer becomes high.

The second thin layer of the present invention comprises a compound represented by a compositional formula of $(Al_{(1-z)}Cr_z)N$ (wherein z represents an atomic ratio of Cr based on the total amount of Al and Cr, and satisfies $0.2 \leq z \leq 0.5$.) and has an average layer thickness of 30 to 200 nm. The second thin layer has low hardness and high Young's modulus. If z is less than 0.2, it is to get close to the characteristics of AN so that hardness is lowered, while if z becomes large exceeding 0.5, hardness is lowered. Therefore, it is set at $0.2 \leq z \leq 0.5$. Among these, it is further preferably $0.25 \leq z \leq 0.35$.

If the average layer thickness of the first thin layer and the second thin layer in the lower layer according to the present invention is less than 30 nm, nucleation rate at the time of coating is increased and grain sizes of the first thin layer and the second thin layer become too fine whereby wear due to dropping of grains of the thin layer is likely progressed at the time of cutting, while if it becomes thick exceeding 200 nm, the effect of preventing propagation of cracks is lowered, and fracture resistance is lowered, so that the average layer thickness of the first thin layer and the average layer thickness of the second thin layer in the lower layer according to the present invention are each set at 30 to 200 nm. Among these, the average layer thickness of the first thin layer and the average layer thickness of the second thin layer in the lower layer are each further preferably 70 to 150 nm. Here, the average layer thickness of the first thin layer and the average layer thickness of the second thin layer of the lower layer were measured by SEM observation of the cross-sectional surface of the lower layer with 30000 to 100000-fold magnification. Incidentally, in addition to the SEM observation, the average layer thickness may be measured by carrying out a TEM observation.

If the average layer thickness of the whole lower layer which is an alternately laminated layer of the present invention is less than 0.12 μm, the effect of preventing propagation of cracks due to impact of machining is lowered, while if it becomes thick exceeding 1.6 μm, chipping is likely caused, so that it is set at 0.12 to 1.6 μm. Among these, the average layer thickness of the whole lower layer of the present invention is further preferably 0.3 to 0.8 μm.

When the undermost layer comprising the compound represented by the compositional formula of $(Al_{(1-a)}Cr_a)N$ (wherein a represents an atomic ratio of Cr based on the total amount of Al and Cr, and satisfies $0.2 \leq a \leq 0.5$.) is present between the cBN sintered body substrate and the lower layer of the present invention, it has high chemical affinity with the cBN sintered body whereby adhesiveness is improved. If the average layer thickness of the undermost layer is less than 20 nm, sufficient adhesiveness cannot be obtained, while if it becomes thick exceeding 200 nm, the effect of preventing propagation of cracks due to impact of machining is lowered, and fracture resistance or chipping resistance is lowered, so that the average layer thickness of the undermost layer is set at 20 to 200 nm. Among these, the average layer thickness of the undermost layer is further preferably 70 to 150 nm. If the atomic ratio of Cr based on the total amount of Al and Cr of the undermost layer is less than 0.2, the crystal form of the undermost layer becomes hexagonal which prevents epitaxial growth from the cBN sintered body so that adhesiveness is lowered, while if it become large exceeding 0.5, an amount of Al having high chemical affinity with the binder phase of the cBN sintered body is lowered, so that adhesiveness with the substrate is lowered. Therefore, it is set at $0.2 \leq a \leq 0.5$. Among these, it is further preferably $0.25 \leq a \leq 0.35$. Incidentally, the lower layer adjacent to the undermost layer of $(Al_{(1-a)}Cr_a)N$ may be either the first thin layer of $(Ti_{(1-y)}Si_y)N$ or the second thin layer of $(Al_{(1-z)}Cr_z)N$. When the second thin layer of the lower layer is coated on the surface of the undermost layer, an AlCrN layer having the average layer thickness of 50 to 400 nm is apparently coated.

In the outermost layer of the present invention, when a layer comprising the compound represented by the compositional formula of TiN having an average layer thickness of 0.05 to 3.0 μm is contained, it is preferred since the corner which was used can be easily identified at the time of machining. If the average layer thickness of the outermost layer is less than 0.05 μm, the appearance color is not uniform so that identification is difficult, while if the average layer thickness of the outermost layer becomes thick exceeding 3.0 82 m, the coating layer likely causes chipping with high possibility during the machining, so that the average layer thickness of the outermost layer is preferably 0.05 to 3.0 μm. Among these, the average layer thickness is further preferably 0.1 to 1.0 μm. Also, if the total layer thickness of the whole coating layer of the present invention is less than 0.4 μm in the average layer thickness, wear resistance tends to be lowered, while if it becomes thick exceeding 6.8 μm, fracture resistance tends to be lowered, so that the total layer thickness of the whole coating layer of the present invention is preferably 0.4 to 6.8 μm in the average layer thickness.

The coated cBN sintered body tool of the present invention comprises the coated cBN sintered body of the present invention at least at the cutting edge thereof. The portion other than the cutting edge may be the coated cBN sintered body of the present invention, or may be a material different from the coated cBN sintered body of the present invention, for example, cemented carbide. More specifically, the cBN sintered body of the present invention is brazed at the cutting edge portion of the cemented carbide processed into the shape of a cutting tool, and then, the coating layer of the present invention may be coated on the surface of the cBN sintered body of the present invention.

In the coated cBN sintered body tool of the present invention, the cBN sintered body as the substrate has excellent fracture resistance and high thermal conductivity. By improving adhesiveness between the cBN sintered body and the coating layer, abnormal wear such as peeling of the coating layer is suppressed. Also, thermal conductivity of the cBN sintered body is high so that temperature increase due to generation of heat at the time of machining can be suppressed, whereby lowering in strength of the coating layer due to temperature increase is prevented. Due to such reasons, the coated cBN sintered body tool of the present invention shows excellent wear resistance and excellent fracture resistance.

The coated cBN sintered body tool of the present invention is excellent in wear resistance, fracture resistance and adhesiveness between the substrate and the coating layer. The coated cBN sintered body tool of the present invention shows excellent performances as a cutting tool, and can elongate tool life. Among these, when the coated cBN sintered body tool of the present invention is used for cutting of a high hardness material such as a hardened steel or a prehardened steel, it has a high effect of elongating tool life, above all, it is further preferred when it is used for cutting of a high hardness material having a hardness HRC 40 or higher.

The coated cBN sintered body of the present invention can be prepared, for example, by the following method.

[Step 1] Coarse particle cBN powders having an average particle size of more than 2.0 μm to 7.0 μm or less, fine particle cBN powders having an average particle size of 0.5 μm or more to 2.0 μm or less, and binder phase-forming powders comprising at least one selected from the group consisting of a metal of Ti, W, Co, Al, a carbide, a nitride, a boride and an oxide of these metals and mutual solid solutions thereof are prepared, and the coarse particle cBN powders, the fine particle cBN powders and the binder phase-forming powders are weighed so that the ratio of the coarse particle cBN powders and the fine particle cBN powders is in a volume ratio within the range of the coarse particle cBN powders:the fine particle cBN powders=(9.5 to 8):(0.5 to 2) (wherein the sum of the coarse particle cBN powders and the fine particle cBN powders is 10.), total of the coarse particle cBN powders and the fine particle cBN powders is 75 to 85% by volume, the binder phase-forming powders are 15 to 25% by volume, and the total thereof is 100% by volume. As mentioned above, by making the ratio of the coarse particle cBN powders having an average particle size of more than 2.0 μm to 7.0 μm or less and the fine particle cBN powders having an average particle size of 0.5 μm or more to 2.0 μm or less in a volume ratio within the range of the coarse particle cBN powders:the fine particle cBN powders=(9.5 to 8):(0.5 to 2) (wherein the sum of the coarse particle cBN powders and the fine particle cBN powders is 10.), an average grain size of cBN can be made within the range of 1.5 to 4.0 μm, as well as the thickness of the binder phase of the cBN sintered body can be made thin, and thermal conductivity of the cBN sintered body can be made high.

[Step 2] The binder phase-forming powders other than the cBN powders are mixed by using a wet ball milling comprising WC-based cemented carbide balls, an organic solvent and a pot, and the organic solvent is evaporated to obtain mixed powders.

[Step 3] The mixed powders are reacted by subjecting to heat treatment at a temperature of 700° C. or higher to 1000° C. or lower to make a phase having brittleness.

[Step 4] The phase having brittleness is mixed by using a wet ball milling comprising WC-based cemented carbide balls, an organic solvent and a pot, and finely pulverized.

[Step 5] The powders of the phase having brittleness obtained in Step 4 and fine particle cBN powders having an average particle size of 0.5 μm or more to 2.0 μm or less are mixed, and the finely pulverized phase having brittleness and fine particle cBN powders are loosen to be uniformly dispersed. The method for mixing and uniformly dispersing may be mentioned a wet ball milling with a mixing time of 1 to 24 hours, and an ultrasonic wave mixing with a mixing time of 1 to 30 minutes, etc.

[Step 6] To the mixed powders obtained in Step 5 is added coarse particle cBN powders having an average particle size of more than 2.0 μm to 7.0 μm or less and mixed to disperse them uniformly. The method for mixing and uniformly dispersing may be mentioned a wet ball milling with a mixing time of 2 to 6 hours, and an ultrasonic wave mixing with a mixing time of 1 to 30 minutes, etc.

[Step 7] The mixed powders obtained in Step 6 is charged in a metal capsule of Ta, Nb, Mo, Zr or the like, the metal capsule is mounted on an ultra-high pressure and high temperature generating apparatus, and sintered under the conditions of a pressure of 6 to 8 GPa and a temperature of 1200 to 1600° C. to obtain the cBN sintered bodies of the present invention.

[Step 8] The obtained cBN sintered bodies of the present invention are each processed into a predetermined tool shape. At this time, the whole cBN sintered body of the present invention may be processed into a tool shape, or the cBN sintered body of the present invention may be brazed on the cutting edge of the other material (for example, cemented carbide) which has been processed into a tool shape.

The method for coating the coating layer of the present invention on the surface of the cBN sintered body may be mentioned an arc ion plating method or a magnetron sputtering method, etc., and an arc ion plating method is more preferred since an ionization rate of the metal element is high, or etching treatment is possible on the surface of the cBN sintered body before coating the coating layer, and excellent in adhesiveness with the coating layer and the cBN sintered body. In the following, the coating method by the arc ion plating method is shown. Incidentally, the layer thickness of each layer can be controlled by the arc discharge time, but it is affected by the kind of the metal target as well, so that the arc discharge time can be optionally adjusted depending on the kind of the metal targets.

[Step 9] The surface of the cBN sintered body tool of the present invention obtained by Step 8 is washed with an organic solvent or water, etc., to make it the substrate. The substrate is mounted on an arc ion plating device in which a metal target corresponding to the metal element of the coating layer has been provided, inside of the device is discharged, and vacuum drawing is carried out until the pressure in the device becomes $1.0 \times 10^{-5}$ to $1.0 \times 10^{-3}$ Pa, while heating the temperature therein from the room temperature to a predetermined temperature in the range of 400 to 650° C. by a heater.

[Step 10] Next, argon gas is introduced thereinto to regulate the pressure in the device to 0.5 to 3.0Pa, a substrate direct-current bias voltage with −100 to −1000V is applied to the substrate, to carry out an etching treatment of the surface of the substrate with the argon ion. After subjecting to the etching treatment, the argon gas is discharged from the device.

[Step 11] Nitrogen gas is introduced into the device to regulate the pressure in the device to 2.0 to 4.0Pa, a substrate direct-current bias voltage is regulated to −30 to −50V, and an arc current of 100 to 180A is supplied to a cathode electrode in which a metal target corresponding to the metal element of the undermost layer has been provided to coat the undermost layer. After coating the undermost layer, the arc discharge is stopped.

[Step 12] Nitrogen gas is introduced into the device to regulate the pressure in the device to 2.0 to 4.0 Pa, a substrate direct-current bias voltage is regulated to −20 to −50V, and an arc current of 100 to 180A was supplied to a cathode electrode in which a metal target corresponding to the metal element of the first thin layer of the lower layer had been provided to coat the first thin layer of the lower layer. After coating the first thin layer, the arc discharge is stopped, and an arc current of 100 to 180A is supplied to a cathode electrode in which a metal target corresponding to the metal element of the second thin layer of the lower layer has been provided to coat the second thin layer of the lower layer. After coating the second thin layer, the arc discharge is stopped. By repeating this process, the lower layer of the alternately laminated layer in which the first thin layer and the second thin layer have been alternately laminated is coated. After coating the lower layer, the arc discharge is stopped, and the nitrogen gas which is the reaction gas is discharged. Incidentally, the lower layer may be coated firstly by coating the second thin film at the undermost layer side and then coating the first thin layer, which are alternately coated.

[Step 13] Argon gas is introduced into the device to regulate the pressure in the device to 2.0 to 4.0 Pa, a substrate direct-current bias voltage is regulated to −20 to −50V, and an arc current of 80 to 120A is supplied to a cathode electrode in which a metal target corresponding to the metal element of the intermediate layer has been provided to coat the intermediate layer. After coating the intermediate layer, the arc discharge is stopped and the argon gas is discharged.

[Step 14] Nitrogen gas and acetylene gas are introduced into the device to regulate the pressure in the device to 2.0 to 4.0Pa, a substrate direct-current bias voltage is regulated to −30 to −120V, and an arc current of 100 to 180A is supplied to a cathode electrode in which a Ti target has been provided to coat the upper layer. At this time, it is preferred that a flow ratio of the nitrogen gas amount is made larger at the initial stage of coating the upper layer, and then, a flow ratio of the acetylene gas amount is gradually increased during the coating. After coating the upper layer, the arc discharge is stopped and the nitrogen gas and the acetylene gas are discharged.

The coated cBN sintered body tool of the present invention can be prepared by the above-mentioned Steps. When the outermost layer is to be further coated, the following Step shall be carried out subsequently.

[Step 15] After coating the upper layer, nitrogen gas is introduced into the device and a pressure in the device is adjusted to 2.0 to 4.0Pa, a substrate direct-current bias voltage is adjusted to −20 to −50V, and an arc current with 100 to 180 A is supplied to the cathode electrode in which a metal target corresponding to the metal element of the outermost layer has been charged to coat the outermost layer. After coating the outermost layer, the arc discharge is stopped and the nitrogen gas which is reaction gas is discharged.

EXAMPLES

Example 1

(Preparation of a Substrate)

As starting powders, coarse particle cBN powders having an average particle size of 5.5 μm, coarse particle cBN powders having an average particle size of 3.2 μm, fine particle cBN powders having an average particle size of 0.3 μm, fine particle cBN powders having an average particle size of 1.0 μm, TiN powders having an average particle size of 1.5 μm, and Al powders having an average particle size of 3.1 μm were prepared, each average particle size of which being measured by the laser diffraction method, and weighed so as to be the formulation composition shown in Table 1.

TABLE 1

| | Formulation composition of starting powders (vol %) | | | | | | | |
|---|---|---|---|---|---|---|---|---|
| | cBN | | | | | | | |
| | Coarse particle | | Fine particle | | Coarse particle: Fine (volume ratio) | | | |
| Substrate No. | Average particle size 5.5 μm | Average particle size 3.2 μm | Average particle size 1.0 μm | Average particle size 0.3 μm | | Total | TiN | Al |
| Substrate 1 | — | 64 | 16 | — | 8:2 | 80 | 12 | 8 |
| Substrate 2 | — | 68 | 17 | — | 8:2 | 85 | 7 | 8 |
| Substrate 3 | 76 | — | 4 | — | 9.5:0.5 | 80 | 12 | 8 |
| Substrate 4 | — | 60 | 15 | — | 8:2 | 75 | 17 | 8 |
| Substrate 5 | — | 72 | 18 | — | 8:2 | 90 | 5 | 5 |
| Substrate 6 | — | 52 | 13 | — | 8:2 | 65 | 25 | 10 |
| Substrate 7 | — | — | — | 80 | 0:10 | 80 | 11 | 9 |
| Substrate 8 | 80 | — | — | — | 10:0 | 80 | 12 | 8 |

The binder phase-forming powders other than the cBN powders were mixed by using wet ball milling comprising WC-based cemented carbide balls, an organic solvent and a pot. The obtained mixed powders were reacted by heat treatment at the temperature of 850° C. to make a phase having brittleness. The obtained phase having brittleness was finely pulverized by using wet ball milling comprising WC-based cemented carbide balls, an organic solvent and a pot.

With regard to the substrates No. 1 to 3, 5 and 6, to the finely pulverized powders of the phase having brittleness were added fine particle cBN powders having an average particle size of 1.0 μm, and mixed with the mixing method shown in Table 2 by using a wet ball milling comprising WC-based cemented carbide balls, an organic solvent and a pot. To the obtained mixture was further added coarse particle cBN powders having an average particle size of 3.2 to 5.5 μm, and mixed with the mixing method shown in Table 2 by using wet ball milling comprising WC-based cemented carbide balls, an organic solvent and a pot to obtain mixed powders.

With regard to the substrate No. 4, to the finely pulverized powders of the phase having brittleness were added fine particle cBN powders having an average particle size of 1.0 μm, and subjected to ultrasonic wave mixing shown in Table 2. To the obtained mixture were further added coarse particle cBN powders having an average particle size of 3.2 μm, and subjected to ultrasonic wave mixing shown in Table 2 to obtain mixed powders.

TABLE 2

| Substrate No. | Mixing step 1: mixing method of powders of a phase having brittleness and fine particle cBN powders | Mixing step 2: mixing method after further adding coarse particle cBN powders |
|---|---|---|
| Substrate 1 | Ball mill mixing for 1 hour | Ball mill mixing for 2 hours |
| Substrate 2 | Ball mill mixing for 1 hour | Ball mill mixing for 2 hours |
| Substrate 3 | Ball mill mixing for 1 hour | Ball mill mixing for 2 hours |
| Substrate 4 | Ultrasonic wave mixing for 15 minutes | Ultrasonic wave mixing for 15 minutes |
| Substrate 5 | Ball mill mixing for 1 hour | Ball mill mixing for 2 hours |
| Substrate 6 | Ball mill mixing for 1 hour | Ball mill mixing for 2 hours |

With regard to the substrate No. 7, to the finely pulverized powders of the phase having brittleness were added fine particle cBN powders having an average particle size of 0.3 µm, and mixed for 10 hours by using wet ball milling comprising WC-based cemented carbide balls, an organic solvent and a pot to obtain mixed powders.

With regard to the substrate No. 8, to the finely pulverized powders of the phase having brittleness were added coarse particle cBN powders having an average particle size of 5.5 µm, and mixed for 2 hours by using wet ball milling comprising WC-based cemented carbide balls, an organic solvent and a pot to obtain mixed powders.

The mixed powders of the thus-obtained substrates Nos. 1 to 8 as mentioned above were each charged in a Ta capsule, the Ta capsule in which the mixed powders have been charged was mounted on an ultra-high pressure and high temperature generating apparatus, and sintered with the sintering temperature and sintering pressure shown in Table 3 to obtain cBN sintered bodies of the substrates Nos. 1 to 8.

TABLE 3

| | Sintering conditions | |
|---|---|---|
| Substrate No. | Sintering temperature (° C.) | Sintering pressure (GPa) |
| Substrate 1 | 1450 | 7.4 |
| Substrate 2 | 1450 | 7.4 |
| Substrate 3 | 1450 | 7.4 |
| Substrate 4 | 1450 | 7.4 |
| Substrate 5 | 1600 | 7.7 |
| Substrate 6 | 1200 | 6.0 |
| Substrate 7 | 1500 | 7.6 |
| Substrate 8 | 1450 | 7.4 |

The obtained cBN sintered bodies were subjected to X-ray diffraction analysis to qualitatively analyze each composition of the cBN sintered bodies. Next, cross-sectional structures of the cBN sintered bodies were photographed by SEM with 3000 to 5000-fold magnification. The obtained photographs of the cross-sectional structure were image analyzed to obtain contents (% by volume) of the cBN and the binder phase. Also, arbitrary straight lines were drawn on the photographs of the cross-sectional structures, and with regard to the binder phases on the straight lines, each length of the straight lines crossing the binder phases was measured as the thickness of the binder phase, and an average value and the standard deviation were obtained. At this time, the number of the measurement of the thickness of the binder phase was 600 portions per one specimen. Further, from the photographs of the cross-sectional structures taken by SEM with 1000 to 5000-fold magnification, an average grain size of the cBN was obtained by using the Fullmann's equation. These results were shown in Table 4.

TABLE 4

| | Sintered body | | | | | |
|---|---|---|---|---|---|---|
| | cBN | | Binder phase | | Thickness of binder phase | |
| Substrate No. | Amount of cBN (vol %) | Average grain size (µm) | Amount of binder phase (vol %) | Composition of binder phase | Average value (µm) | Standard deviation (µm) |
| Substrate 1 | 77 | 2.1 | 23 | TiN, $TiB_2$, $AlB_2$, AlN, $Al_2O_3$, WB, WC | 0.3 | 0.4 |
| Substrate 2 | 83 | 2.2 | 17 | TiN, $TiB_2$, $AlB_2$, AlN, $Al_2O_3$, WB, WC | 0.3 | 0.3 |
| Substrate 3 | 78 | 3.8 | 22 | TiN, $TiB_2$, $AlB_2$, AlN, $Al_2O_3$, WB, WC | 0.4 | 0.5 |
| Substrate 4 | 73 | 2.2 | 27 | TiN, $TiB_2$, $AlB_2$, AlN, $Al_2O_3$, WB, WC | 0.4 | 0.5 |
| Substrate 5 | 89 | 2.1 | 11 | TiN, $TiB_2$, $AlB_2$, AlN, $Al_2O_3$, WB, WC | 0.2 | 0.3 |
| Substrate 6 | 63 | 2.1 | 37 | TiN, $TiB_2$, $AlB_2$, AlN, $Al_2O_3$, WB, $W_2B$, WC, W | 0.8 | 0.8 |
| Substrate 7 | 78 | 0.3 | 22 | TiN, $TiB_2$, $AlB_2$, AlN, $Al_2O_3$, WB, WC | 0.1 | 0.1 |
| Substrate 8 | 79 | 5.5 | 21 | TiN, $TiB_2$, $AlB_2$, AlN, $Al_2O_3$, WB, WC | 0.6 | 0.6 |

By using EDS, an amount of the tungsten element contained in the cBN sintered body was measured. Also, thermal conductivity of the cBN sintered body was measured by laser flash method. These results are shown in Table 5.

TABLE 5

| Substrate No. | Amount of tungsten element (% by mass) | Thermal conductivity (W/(m · K)) |
|---|---|---|
| Substrate 1 | 1.8 | 92 |
| Substrate 2 | 2.3 | 98 |
| Substrate 3 | 2.7 | 103 |
| Substrate 4 | 0.2 | 85 |
| Substrate 5 | 3.1 | 105 |
| Substrate 6 | 1.0 | 68 |
| Substrate 7 | 2.0 | 64 |
| Substrate 8 | 3.2 | 108 |

The coated cBN sintered body tools of Present products 1 to 8 and Comparative products 1 to 8 were each prepared by forming the undermost layer, the lower layer, the intermediate layer, the upper layer and the outermost layer (Present products 6, 7 and Comparative products 6, 7 are excluded) having the composition and the layer thickness shown in Table 6 successively on the substrate shown in Table 6 under the following conditions.

(1) Preparation of the Substrate

With respect to each specimen of Present products 1 to 8 and Comparative products 1 to 8, ISO standard CNGA120408-shaped cemented carbide was used as a base metal, and the cBN sintered body shown in Table 6 was brazed on the corner portion of the cemented carbide base metal which became a cutting edge. The upper-and-lower surface and the circumference surface thereof were grinded by a diamond grindstone with #270 mesh, subsequently, chamfer honing with an angle of −25°×width of 0.15 mm was applied to the cutting edge line by a diamond grindstone with #400 mesh. Further, a rotary brush was pressed against the cutting edge line between the flank and chamfer honing surfaces to carry out round honing processing. Round honing with a desired radius of curvature was applied thereto while adjusting the processing time and measuring with a contracer. The obtained cBN sintered body tool after the processing was used as the substrate. The substrate was washed with ethanol and acetone, and then, subjected to vacuum drying treatment.

With regard to the respective specimens, the substrate was mounted on the rotatable table in the arc ion plating device, and a metal target corresponding to the metal element of the coating layer shown in Table 6 was provided as a cathode electrode (evaporation source). First, inside of the device was discharged, and vacuum drawing was carried out until the pressure in the device became $1.0 \times 10^{-4}$ Pa while heating the device with a heater to 500° C. Next, argon gas was introduced thereinto and the pressure in the device was maintained at 0.7 Pa, a substrate direct-current bias voltage of −200V was applied to the substrate while rotating the table, whereby the surface of the substrate was subjected to etching with the argon ion, and then, the argon gas was discharged from the device.

(2) Formation of the Undermost Layer

With regard to the respective specimens, nitrogen gas was introduced into the device as reaction gas while rotating the table, and a flow amount of the nitrogen gas was so adjusted that the pressure in the device became 3.0 Pa. A substrate direct-current bias voltage was adjusted to −40V, an arc current of 150 A was supplied to a cathode electrode in which a metal target corresponding to the metal element of the undermost layer shown in Table 6 had been provided to coat the undermost layer by changing a discharge time within the range of 5 to 15 minutes depending on the layer thickness to be formed, and then, arc discharge was stopped.

(3) Formation of the Lower Layer

Subsequently, with regard to the respective specimens, while rotating the table, nitrogen gas was introduced into the device as reaction gas, and a flow amount of the nitrogen gas was so adjusted that the pressure in the device became 3.0 Pa. While maintaining a substrate direct-current bias voltage to −40V, an arc current of 150A was supplied to a cathode electrode in which a metal target corresponding to the metal element of the first thin layer of the lower layer shown in Table 6 had been provided to coat the first thin layer of the lower layer by changing a discharge time within the range of 5 to 20 minutes depending on the layer thickness to be formed. After coating the first thin layer, arc discharge was stopped, an arc current of 150A was supplied to a cathode electrode in which a metal target corresponding to the metal element of the second thin layer of the lower layer shown in Table 6 had been provided to coat the second thin layer of the lower layer by changing a discharge time within the range of 8 to 25 minutes depending on the layer thickness to be formed. After coating the second thin layer, arc discharge was stopped. By repeating these processes, with regard to Present products 1 to 8 and Comparative products 1 to 4, after coating the lower layer of an alternately laminated layer in which the first thin layer and the second thin layer were alternately laminated from the first thin layer so that the first thin layer was at the substrate side and the second thin layer was at the surface side, with 2 to 4 layers of the first thin layer having an average layer thickness shown in Table 6 and 2 to 4 layers of the second thin layer having an average layer thickness shown in Table 6, the total of which was 4 to 8 layers, and with regard to Comparative products 5 to 8, after coating the lower layer of an alternately laminated layer in which the first thin layer and the second thin layer were alternately laminated from the first thin layer so that the first thin layer was at the substrate side and the second thin layer was at the surface side, with 1 to 20 layers of the first thin layer having an average layer thickness shown in Table 6 and 1 to 20 layers of the second thin layer having an average layer thickness shown in Table 6, the total of which was 2 to 40 layers, arc discharge was stopped and the nitrogen gas which was the reaction gas was discharged.

(4) Formation of the Intermediate Layer

After coating the lower layer of an alternately laminated layer, with regard to the respective specimens, argon gas was introduced and the pressure in the device was maintained at 3.0 Pa, in the state that a substrate direct-current bias voltage of −40V was applied to the substrate, an arc current of 100 A was supplied to a cathode electrode in which a metal target corresponding to the metal element of the intermediate layer shown in Table 6 had been provided, depending on the layer thickness to be formed, a discharge time was changed within the range of 4 to 15 minutes with regard to Present products 1 to 8 and Comparative products 1 to 4, and a discharge time was changed within the range of 8 to 15 minutes with regard to Comparative products 5 to 8, to coat the intermediate layer respectively, and thereafter, arc discharge was stopped and the argon gas was discharged.

(5-1) Formation of the Upper Layer

With regard to the respective specimens Present products 1 to 5 and Comparative products 1 to 4, 5 and 8, after coating the intermediate layer, nitrogen gas was introduced into the device as reaction gas, and a flow amount of the nitrogen gas was so adjusted that the pressure in the device became 3.0 Pa, a substrate direct-current bias voltage was adjusted to −100V, and an arc current of 150 A was supplied to a cathode electrode in which a Ti target had been provided. Subsequently, acetylene gas was immediately introduced therein. Thereafter, a flow amount of the acetylene gas was gradually increased, and at the final stage at which the desired layer thickness was formed, the mixed gas was so adjusted that the flow amount ratio (volume ratio) of the nitrogen gas:the acetylene gas became a ratio of (5 to 3):1, and the flow amount of the mixed gas was so adjusted that the pressure in the device became 3.0 Pa. Incidentally, with regard to Present products 1 to 5 and Comparative products 1 to 4, a discharge time was adjusted within the range of 15 to 90 minutes depending on the layer thickness to be formed. With regard to Comparative products 5 and 8, the upper layer was coated with a discharge time of 50 minutes. After the upper layer was thus coated, arc discharge was stopped and the nitrogen gas and acetylene gas were discharged.

(5-2) Formation of the Upper Layer

With regard to Present products 6 to 8, after coating the intermediate layer, nitrogen gas and acetylene gas were introduced into the device as reaction gases. At this time, the mixed gas was so adjusted that a flow amount ratio (volume ratio) of the nitrogen gas:the acetylene gas became a ratio of (8 to 5):1, further a flow amount of the mixed gas was so adjusted that the pressure in the device became 3.0 Pa, a substrate direct-current bias voltage was adjusted to −100V, and an arc current of 150A was supplied to a cathode electrode in which a Ti target had been provided. A discharge time was adjusted within the range of 20 to 50 minutes depending on the layer thickness to be formed to coat the upper layer, and thereafter, arc discharge was stopped and the nitrogen gas and acetylene gas were discharged.

(5-3) Formation of the Upper Layer

With regard to Comparative products 6 and 7, nitrogen gas was introduced into the device as reaction gas, a flow amount of the nitrogen gas was so adjusted that the pressure in the device became 3.0 Pa, a substrate direct-current bias voltage was adjusted to −40V, an arc current of 150 A was supplied to a cathode electrode in which a metal target corresponding to the metal element of the upper layer shown in Table 6 had been provided, a discharge time was adjusted within the range of 50 to 60 minutes depending on the layer thickness to be formed to coat the upper layer, and thereafter, arc discharge was stopped and the nitrogen gas which was the reaction gas was discharged. The coated cBN sintered body tools of Comparative products 6 and 7 were thus prepared.

(6) Formation of the Outermost Layer

Subsequently, with regard to Present products 1 to 5, 8 and Comparative products 1 to 4, nitrogen gas was introduced into the device as reaction gas, a flow amount of the nitrogen gas was so adjusted that the pressure in the device became 3.0 Pa, a substrate direct-current bias voltage was adjusted to −40V, an arc current of 150 A was supplied to a cathode electrode in which a metal target corresponding to the metal element of the outermost layer shown in Table 6 had been provided, a discharge time was adjusted within the range of 15 to 45 minutes depending on the layer thickness to be formed to coat the upper layer, and thereafter, arc discharge was stopped and the nitrogen gas which was the reaction gas was discharged.

Also, with regard to Comparative products 5 and 8, nitrogen gas was introduced into the device as reaction gas, a flow amount of the nitrogen gas was so adjusted that the pressure in the device became 3.0 Pa, a substrate direct-current bias voltage was adjusted to −40V, an arc current of 150 A was supplied to a cathode electrode in which a Ti target had been provided, a discharge time was set at 15 minutes depending on the layer thickness to be formed to coat the upper layer, and thereafter, arc discharge was stopped and the nitrogen gas was discharged. The coated cBN sintered body tools of Comparative products 5 and 8 were thus prepared.

As mentioned above, coated cBN sintered body tools of Present products 1 to 8 and Comparative products 1 to 8 were each prepared.

With regard to the obtained Present products and Comparative products, SEM observation, EDS measurement attached to the SEM, TEM observation, and EDS measurement attached to the TEM were carried out to measure the layer thickness and the composition of each layer. These results are shown in Table 6. Further, with regard to the obtained Present products and Comparative products, the following Cutting tests [1], [2] and [3] were carried out.

TABLE 6

| | | Coating layer | | | | | | |
|---|---|---|---|---|---|---|---|---|
| | | Undermost layer | | Lower layer | | | | |
| | | | | First thin layer | | Second thin layer | | |
| Specimen No. | Substrate | Composition | Layer thickness/ nm | Composition | Layer thickness/ nm | Composition | Layer thickness/ nm | Layer thickness μm |
| Present product 1 | Substrate 1 | $Al_{0.70}Cr_{0.30}N$ | 100 | $Ti_{0.85}Si_{0.15}N$ | 70 | $Al_{0.70}Cr_{0.30}N$ | 110 | 0.54 |
| Present product 2 | Substrate 2 | $Al_{0.70}Cr_{0.30}N$ | 100 | $Ti_{0.85}Si_{0.15}N$ | 70 | $Al_{0.70}Cr_{0.30}N$ | 110 | 0.54 |
| Present product 3 | Substrate 3 | $Al_{0.70}Cr_{0.30}N$ | 100 | $Ti_{0.85}Si_{0.15}N$ | 70 | $Al_{0.70}Cr_{0.30}N$ | 110 | 0.54 |
| Present product 4 | Substrate 4 | $Al_{0.70}Cr_{0.30}N$ | 100 | $Ti_{0.85}Si_{0.15}N$ | 70 | $Al_{0.70}Cr_{0.30}N$ | 110 | 0.54 |
| Present product 5 | Substrate 1 | $Al_{0.80}Cr_{0.20}N$ | 200 | $Ti_{0.70}Si_{0.30}N$ | 200 | $Al_{0.80}Cr_{0.20}N$ | 200 | 1.6 |
| Present product 6 | Substrate 1 | $Al_{0.50}Cr_{0.50}N$ | 30 | $Ti_{0.99}Si_{0.01}N$ | 30 | $Al_{0.50}Cr_{0.50}N$ | 30 | 0.12 |
| Present product 7 | Substrate 1 | $Al_{0.70}Cr_{0.30}N$ | 100 | $Ti_{0.85}Si_{0.15}N$ | 70 | $Al_{0.70}Cr_{0.30}N$ | 110 | 0.54 |
| Present product 8 | Substrate 1 | $Al_{0.70}Cr_{0.30}N$ | 100 | $Ti_{0.85}Si_{0.15}N$ | 70 | $Al_{0.70}Cr_{0.30}N$ | 110 | 0.54 |
| Comparative product 1 | Substrate 5 | $Al_{0.70}Cr_{0.30}N$ | 100 | $Ti_{0.85}Si_{0.15}N$ | 70 | $Al_{0.70}Cr_{0.30}N$ | 110 | 0.54 |
| Comparative product 2 | Substrate 6 | $Al_{0.70}Cr_{0.30}N$ | 100 | $Ti_{0.85}Si_{0.15}N$ | 70 | $Al_{0.70}Cr_{0.30}N$ | 110 | 0.54 |
| Comparative product 3 | Substrate 7 | $Al_{0.70}Cr_{0.30}N$ | 100 | $Ti_{0.85}Si_{0.15}N$ | 70 | $Al_{0.70}Cr_{0.30}N$ | 110 | 0.54 |
| Comparative product 4 | Substrate 8 | $Al_{0.70}Cr_{0.30}N$ | 100 | $Ti_{0.85}Si_{0.15}N$ | 70 | $Al_{0.70}Cr_{0.30}N$ | 110 | 0.54 |
| Comparative product 5 | Substrate 1 | $Al_{0.70}Cr_{0.30}N$ | 100 | $Ti_{0.85}Si_{0.15}N$ | 15 | $Al_{0.70}Cr_{0.30}N$ | 15 | 0.6 |
| Comparative product 6 | Substrate 1 | $Ti_{0.50}Al_{0.50}N$ | 100 | $Al_{0.50}Cr_{0.50}N$ | 300 | $Ti_{0.50}Al_{0.50}N$ | 300 | 0.6 |
| Comparative product 7 | Substrate 1 | $Al_{0.50}Cr_{0.20}$-$Ti_{0.30}N$ | 100 | $Ti_{0.45}Al_{0.50}$-$Si_{0.05}N$ | 100 | $Al_{0.50}Cr_{0.20}$-$Ti_{0.30}N$ | 100 | 0.6 |
| Comparative product 8 | Substrate 5 | $Al_{0.70}Cr_{0.30}N$ | 100 | $Ti_{0.85}Si_{0.15}N$ | 15 | $Al_{0.70}Cr_{0.30}N$ | 15 | 0.6 |

TABLE 6-continued

| | Coating layer | | | | | | | |
|---|---|---|---|---|---|---|---|---|
| | Intermediate layer | | Upper layer | | | Outermost layer | | Total |
| | Composition | Layer thickness/ nm | Composition | Layer thickness/ μm | Presence of inclination | Composition | Layer thickness/ μm | layer thickness/ μm |
| Present product 1 | Ti | 30 | Ti($C_{0.50}N_{0.50}$) | 0.9 | Present | TiN | 0.2 | 1.77 |
| Present product 2 | Ti | 30 | Ti($C_{0.50}N_{0.50}$) | 0.9 | Present | TiN | 0.2 | 1.77 |
| Present product 3 | Ti | 30 | Ti($C_{0.50}N_{0.50}$) | 0.9 | Present | TiN | 0.2 | 1.77 |
| Present product 4 | Ti | 30 | Ti($C_{0.50}N_{0.50}$) | 0.9 | Present | TiN | 0.2 | 1.77 |
| Present product 5 | AlCr | 100 | Ti($C_{0.70}N_{0.30}$) | 2.0 | Present | TiN | 1.0 | 4.90 |
| Present product 6 | TiSi | 10 | Ti($C_{0.20}N_{0.80}$) | 0.3 | None | — | — | 0.46 |
| Present product 7 | Ti | 30 | Ti($C_{0.50}N_{0.50}$) | 0.9 | None | — | — | 1.57 |
| Present product 8 | TiAl | 30 | Ti($C_{0.50}N_{0.50}$) | 0.9 | None | CrN | 0.2 | 1.77 |
| Comparative product 1 | Ti | 30 | Ti($C_{0.50}N_{0.50}$) | 0.9 | Present | TiN | 0.2 | 1.77 |
| Comparative product 2 | Ti | 30 | Ti($C_{0.50}N_{0.50}$) | 0.9 | Present | TiN | 0.2 | 1.77 |
| Comparative product 3 | Ti | 30 | Ti($C_{0.50}N_{0.50}$) | 0.9 | Present | TiN | 0.2 | 1.77 |
| Comparative product 4 | Ti | 30 | Ti($C_{0.50}N_{0.50}$) | 0.9 | Present | TiN | 0.2 | 1.77 |
| Comparative product 5 | Ti | 30 | Ti($C_{0.50}N_{0.50}$) | 0.9 | Present | TiN | 0.2 | 1.83 |
| Comparative product 6 | TiAl | 50 | $Ti_{0.50}Al_{0.50}N$ | 1.0 | None | — | — | 1.75 |
| Comparative product 7 | TiAlSi | 50 | $Ti_{0.45}Al_{0.50}Si_{0.05}N$ | 1.2 | None | — | — | 1.95 |
| Comparative product 8 | Ti | 30 | Ti($C_{0.50}N_{0.50}$) | 0.9 | Present | TiN | 0.2 | 1.83 |

Cutting Test [1]: Continuous Cutting
Cutting way: External diameter continuous turning, DRY
Work piece material: SCM415H (carburized and hardened steel), HRC58 to 62, cylindrical
(External diameter: 63 mm, Length: 200 mm)
Cutting speed: 150 m/min
Feed rate: 0.10 mm/rev
Depth of cut: 0.15 mm
Tool life: Cutting time until flank wear became 0.15 mm or cutting time at which cutting edge fracture occured
Cutting Test [2]: Deep Depth Turning
Cutting way: turning of a carburized and hardened steel having different hardness at the surface and at the inside thereof ((A) Three passes of turning were carried out with regard to the hard portion of HRC62 to 58 where a cutting width per one pass was 10 mm.→(B) Three passes of turning were carried out with regard to the soft portion of HRC57 to 40 where a cutting width per one pass was 10 mm. Thereafter, the cuttings of (A)→(B)→(A)→(B) were repeated until the tool reached to its tool life.), DRY
Work piece material: SCM415H (carburized and hardened steel), a hardness of the hard portion from the surface to the depth of 0.9 mm was HRC62 to 58, and a hardness of the soft portion which was inside of the hard portion was HRC57 to 40, cylindrical (External diameter: 63 mm, Length: 200 mm)
Cutting speed: 100 m/min
Feed rate: 0.10 mm/rev
Depth of cut: 0.30 mm
Cutting width per one pass: 10 mm
Tool life: Cutting time until flank wear became 0.15 mm or cutting time at which cutting edge fracture occured
Cutting Test [3]: Interrupted Cutting
Cutting way: External diameter interrupted turning, DRY
Work piece material: SCM435H (carburized and hardened steel), HRC58 to 60, cylindrical
(External diameter: 48 mm, Length: 200 mm) with two V shape grooves
Cutting speed: 150 m/min
Feed rate: 0.10 mm/rev
Depth of cut: 0.15 mm
Tool life: Cutting time until flank wear became 0.15 mm or cutting time at which cutting edge fracture occurred In Table 7, tool lives (min) in Cutting tests [1], [2] and [3] were described. Also, total evaluation was carried out on the cutting performances of Present products and Comparative products from the tool life and damaged form of Cutting tests [1], [2] and [3]. With regard to the tool life in Cutting tests [1], [2] and [3], in Cutting test [1], grading was carried out wherein 100 minutes or longer is 1 point, 90 to 99 minutes 2 point, 80 to 89 minutes 3 point, 70 to 79 minutes 4 point, and 69 minutes or shorter 5 point. In Cutting test [2], grading was carried out wherein 20 minutes or longer is 1 point, 17 to 19 minutes 2 point, 14 to 16 minutes 3 point, 11 to 13 minutes 4 point, and 10 minutes or shorter 5 point. In Cutting test [3], grading was carried out wherein 40 minutes or longer is 1 point, 33 to 39 minutes 2 point, 26 to 32 minutes 3 point, 19 to 25 minutes 4 point, and 18 minutes or shorter 5 point. Next, the points in Cutting tests [1], [2] and [3] were added up, and total evaluation (good ⊚>○>▲>x bad) was carried out wherein 3 to 5 points are ⊚, 6 to 8 points ○, 9 to 12 points ▲, and 13 to 15 points x. The results of the total evaluation are also shown in Table 7 together.

TABLE 7

| Specimen No. | Tool life (min) | | | Total evaluation |
| --- | --- | --- | --- | --- |
| | Continuous cutting [1] | Deep depth cutting [2] | Interrupted cutting [3] | |
| Present product 1 | 100 | 20 | 40 | ⊚ |
| Present product 2 | 108 | 17 | 36 | ⊚ |
| Present product 3 | 104 | 15 | 34 | ○ |
| Present product 4 | 97 | 16 | 38 | ○ |
| Present product 5 | 92 | 22 | 47 | ⊚ |
| Present product 6 | 94 | 17 | 38 | ○ |
| Present product 7 | 98 | 19 | 42 | ⊚ |
| Present product 8 | 99 | 21 | 40 | ⊚ |
| Comparative product 1 | 72 | 13 | 30 | ▲ |
| Comparative product 2 | 63 | 14 | 24 | ▲ |
| Comparative product 3 | 74 | 12 | 27 | ▲ |
| Comparative product 4 | 80 | 8 | 17 | X |
| Comparative product 5 | 67 | 11 | 24 | X |
| Comparative product 6 | 92 | 14 | 17 | ▲ |
| Comparative product 7 | 64 | 13 | 29 | ▲ |
| Comparative product 8 | 48 | 9 | 30 | X |

From Table 7, it can be understood that Present products have longer tool life and better total evaluation in all of the cutting conditions as compared with those of Comparative products.

Utilizability in Industry

The coated cBN sintered body tool of the present invention has excellent fracture resistance and excellent wear resistance. When it is used as a cutting tool, it shows excellent properties, and can elongate tool life. In particular, it shows high effect in cutting of a high hardness material.

The invention claimed is:

1. A coated cBN sintered body tool comprising a substrate of a cBN sintered body and a coating layer coated on a surface thereof, wherein
the cBN sintered body comprises:
73 to 84% by volume of cBN; and
16 to 27% by volume of a binder phase which comprises at least one selected from the group consisting of a metal of Ti, W, Co and Al, a carbide, carbonitride, a nitride, a boronitride, a boride and an oxide of these metals and a mutual solid solution thereof, and inevitable impurities;
an average grain size of the cBN is 1.5 to 4.0 μm, an average value of the thickness of the binder phase is 0.05 to 0.5 μm, a standard deviation of a thickness of the binder phase is 0.5 μm or less,
the coating layer comprises an upper layer, an intermediate layer, a lower layer and an undermost layer, wherein
(1) the upper layer comprises a compound represented by a compositional formula of $Ti(C_xN_{(1-x)})$,
wherein x represents an atomic ratio of C based on the total amount of C and N, and satisfies $0 \leq x \leq 0.7$, and has an average layer thickness of 0.3 to 2.0 μm,
(2) the intermediate layer comprises at least one metal selected from the components of Ti, Al, Cr and Si, and has an average layer thickness of 10 to 100 nm,
(3) the lower layer comprises an alternately laminated layer comprising
a first thin layer which comprises a compound represented by a compositional formula of $(Ti_{(1-y)}Si_y)N$
wherein y represents an atomic ratio of Si based on the total amount of Ti and Si, and satisfies $0.01 \leq y \leq 0.3$, and has an average layer thickness of 30 to 200 nm, and
a second thin layer which comprises a compound represented by a compositional formula of $(Al_{(1-z)}Cr_z)N$
wherein z represents an atomic ratio of Cr based on the total amount of Al and Cr, and satisfies $0.2 \leq z \leq 0.5$,
and has an average layer thickness of 30 to 200 nm,
the first and second thin layers being alternately laminated with an average layer thickness of 0.12 to 1.6 μm with respect to the whole alternately laminated layer, and
(4) the undermost layer comprises a compound represented by a compositional formula of $(Al_{(1-a)}Cr_a)N$
wherein a represents an atomic ratio of Cr based on the total amount of Al and Cr, and satisfies $0.2 \leq a \leq 0.5$, and has an average layer thickness of 20 to 200 nm.

2. The coated cBN sintered body tool according to claim 1, wherein the cBN sintered body comprises 75 to 80% by volume of cBN, and 20 to 25% by volume of the binder phase and inevitable impurities, an average grain size of the cBN is 2.0 to 3.0 μm, an average value of the thickness of the binder phase is 0.1 to 0.4 μm, and the standard deviation of the thickness of the binder phase is 0.05 to 0.4 μm.

3. The coated cBN sintered body tool according to claim 1, wherein thermal conductivity of the cBN sintered body is 70 W/(m·K) or more.

4. The coated cBN sintered body tool according to claim 1, wherein thermal conductivity of the cBN sintered body is 80 to 160 W/(m·K).

5. The coated cBN sintered body tool according to claim 1, wherein an amount of the tungsten element contained in the cBN sintered body is 3% by mass or less based on the whole cBN sintered body.

6. The coated cBN sintered body tool according to claim 1, wherein an amount of the tungsten element contained in the cBN sintered body is 0.2 to 2% by mass based on the whole cBN sintered body.

7. The coated cBN sintered body tool according to claim 1, wherein the binder phase of the cBN sintered body comprises at least one selected from the group consisting of metals of Ti, W, Co and Al, a carbide, a carbonitride, a nitride, a boronitride, a boride or an oxide of these metals, and mutual solid solution thereof.

8. The coated cBN sintered body tool according to claim 1, wherein the binder phase of the cBN sintered body comprises at least one selected from TiN, TiCN, TiC, $TiB_2$, TiBN, TiAlN, $Ti_2AlN$, AlN, $AlB_2$, $Al_2O_3$, WC, WB, $W_2B$, CoWB, $W_2Co_{21}B_6$, $Co_3W_3C$, W, Co and Ti.

9. The coated cBN sintered body tool according to claim 1, wherein the binder phase of the cBN sintered body comprises at least one of TiN, TiCN, TiC, AlN, $AlB_2$, $Al_2O_3$, $TiB_2$, CoWB, $W_2Co_{21}B_6$ and WC.

10. The coated cBN sintered body tool according to claim 1, wherein the binder phase of the cBN sintered body comprises at least one of TiN, TiCN, TiC, AlN, $AlB_2$, $Al_2O_3$ and $TiB_2$.

11. The coated cBN sintered body tool according to claim 1, wherein an average value of the thickness of the binder phase is 0.1 to 0.4 μm.

12. The coated cBN sintered body tool according to claim 1, wherein the intermediate layer comprises a metal represented by a compositional formula of Ti or AlCr and has an average layer thickness of 10 to 100 nm.

13. The coated cBN sintered body tool according to claim 1, wherein the intermediate layer comprises a metal represented by a compositional formula of Ti and has an average layer thickness of 10 to 100 nm.

14. The coated cBN sintered body tool according to claim 1, wherein the upper layer is constituted by a compound represented by a compositional formula of $Ti(C_xN_{(1-x)})$
where x represents an atomic ratio of C based on the total amount of C and N, and satisfies $0 \leq x \leq 0.7$,
and has an average layer thickness of 0.3 to 2.0 μm, comprising an inclined compositional layer in which an atomic ratio of C based on the total amount of C and N is increased from the substrate side to the surface side.

15. The coated cBN sintered body tool according to claim 1, wherein the upper layer is constituted by a compound represented by a compositional formula of $Ti(C_xN_{(1-x)})$
where x represents an atomic ratio of C based on the total amount of C and N, and satisfies $0.4 \leq x \leq 0.6$,
having an average layer thickness of 0.5 to 1.5 μm.

16. The coated cBN sintered body tool according to claim 1, wherein the first thin layer of the lower layer is constituted by a compound having the compositional formula of $(Ti_{(1-y)}Si_y)N$
wherein y represents an atomic ratio of Si based on the total amount of Ti and Si, and satisfies $0.05 \leq y \leq 0.2$,
having an average layer thickness of 70 to 150 nm.

17. The coated cBN sintered body tool according to claim 1, wherein the second thin layer of the lower layer is constituted by a compound represented by a compositional formula of $(Al_{(1-z)}Cr_z)N$,
where z represents an atomic ratio of Cr based on the total amount of Al and Cr, and satisfies $0.25 \leq z \leq 0.35$,
having an average layer thickness of 70 to 150 nm.

18. The coated cBN sintered body tool according to claim 1, wherein the lower layer is an alternately laminated layer having an average layer thickness of 0.3 to 0.8 μm with respect to the whole alternately laminated layer.

19. The coated cBN sintered body tool according to claim 1, wherein the undermost layer is constituted by a compound represented by a compositional formula of $(Al_{(1-a)}Cr_a)N$ (provided that a represents an atomic ratio of Cr based on the total amount of Al and Cr, and satisfies $0.25 \leq a \leq 0.35$.) having an average layer thickness of 70 to 150 nm.

20. The coated cBN sintered body tool according to claim 1, wherein a total layer thickness of the whole coating layer is 0.4 to 6.8 μm in an average film thickness.

21. The coated cBN sintered body tool according to claim 1, wherein an outermost layer comprising a compound represented by a compositional formula of TiN and having an average layer thickness of 0.05 to 3.0 μm is coated on the surface of the upper layer.

22. A tool capable of machining a high hardness material comprising the coated cBN sintered body tool according to claim 1.

23. The tool according to claim 22, capable of machining a high hardness material having a hardness of HRC 40 or more.

* * * * *